(12) United States Patent
Chow et al.

(10) Patent No.: US 8,422,243 B2
(45) Date of Patent: Apr. 16, 2013

(54) INTEGRATED CIRCUIT PACKAGE SYSTEM EMPLOYING A SUPPORT STRUCTURE WITH A RECESS

(75) Inventors: Seng Guan Chow, Singapore (SG); Antonio B. Dimaano, Jr., Singapore (SG)

(73) Assignee: Stats Chippac Ltd., Singapore (SG)

( * ) Notice: Subject to any disclaimer, the term of this patent is extended or adjusted under 35 U.S.C. 154(b) by 1058 days.

(21) Appl. No.: 11/610,401

(22) Filed: Dec. 13, 2006

(65) Prior Publication Data

US 2008/0142938 A1 Jun. 19, 2008

(51) Int. Cl.
*H05K 7/00* (2006.01)

(52) U.S. Cl.
USPC ........... 361/760; 361/761; 361/764; 257/666; 257/692; 257/707; 257/729; 257/777

(58) Field of Classification Search ........... 361/760, 361/761, 764; 257/666–678, 691, 696, 706, 257/707, 712–719, 730, 776, 692, 729, 777; 29/827, 834, 841
See application file for complete search history.

(56) References Cited

U.S. PATENT DOCUMENTS

| | | | | |
|---|---|---|---|---|
| 4,758,927 A * | 7/1988 | Berg | .............................. | 361/761 |
| 5,569,625 A * | 10/1996 | Yoneda et al. | .................. | 29/827 |
| 6,093,959 A * | 7/2000 | Hong et al. | .................... | 257/692 |
| 6,175,241 B1 * | 1/2001 | Hembree et al. | ............. | 324/755 |
| 6,246,111 B1 * | 6/2001 | Huang et al. | ................... | 257/675 |
| RE37,416 E * | 10/2001 | Spatrisano et al. | ............. | 29/841 |
| 6,355,502 B1 * | 3/2002 | Kang et al. | ..................... | 438/110 |
| 6,380,048 B1 * | 4/2002 | Boon et al. | ..................... | 438/456 |
| 6,455,348 B1 * | 9/2002 | Yamaguchi | .................... | 438/106 |
| 6,545,347 B2 * | 4/2003 | McClellan | ..................... | 257/690 |
| 6,552,417 B2 * | 4/2003 | Combs | ......................... | 257/666 |
| 6,552,428 B1 * | 4/2003 | Huang et al. | .................. | 257/706 |
| 6,608,366 B1 * | 8/2003 | Fogelson et al. | ............. | 257/666 |
| 6,661,083 B2 * | 12/2003 | Lee et al. | ........................ | 257/676 |
| 6,706,557 B2 * | 3/2004 | Koopmans | ..................... | 438/109 |
| 6,734,552 B2 * | 5/2004 | Combs et al. | ................. | 257/707 |
| 6,818,973 B1 * | 11/2004 | Foster | ............................ | 257/676 |
| 6,825,062 B2 * | 11/2004 | Yee et al. | ....................... | 438/106 |
| 6,906,414 B2 * | 6/2005 | Zhao et al. | ..................... | 257/707 |
| 6,977,431 B1 * | 12/2005 | Oh et al. | ........................ | 257/696 |
| 7,091,581 B1 | 8/2006 | McLellan et al. | | |
| 7,119,421 B2 * | 10/2006 | Rohrmoser et al. | .......... | 257/666 |
| 7,166,908 B2 * | 1/2007 | Minamio et al. | ............... | 257/680 |
| 7,245,500 B2 * | 7/2007 | Khan et al. | ..................... | 361/760 |
| 7,563,647 B2 * | 7/2009 | Bathan et al. | .................. | 438/122 |
| 7,572,675 B2 * | 8/2009 | Narasimalu et al. | .......... | 438/115 |
| 2002/0130400 A1 * | 9/2002 | Jeong et al. | .................... | 257/670 |
| 2002/0140061 A1 * | 10/2002 | Lee | ................................ | 257/666 |
| 2002/0149099 A1 * | 10/2002 | Shirasaka et al. | ............. | 257/692 |
| 2003/0151120 A1 * | 8/2003 | Hundt et al. | ................... | 257/666 |
| 2004/0061217 A1 * | 4/2004 | Ku et al. | ........................ | 257/708 |
| 2004/0217450 A1 * | 11/2004 | Li et al. | ......................... | 257/666 |
| 2005/0001294 A1 * | 1/2005 | Li et al. | ......................... | 257/666 |
| 2005/0029638 A1 * | 2/2005 | Ahn et al. | ...................... | 257/676 |

(Continued)

*Primary Examiner* — Xiaoliang Chen
(74) *Attorney, Agent, or Firm* — Ishimaru & Associates LLP

(57) ABSTRACT

An integrated circuit package system that includes: providing an electrical interconnect system including a support structure and a lead-finger system; processing a top edge of the support structure along an outermost periphery thereof, to include a recess for preventing mold bleed, the recess surrounded by the lead finger system; and encapsulating the recess and the electrical interconnect system with an encapsulation material to interlock the encapsulation material.

10 Claims, 5 Drawing Sheets

U.S. PATENT DOCUMENTS

| | | | |
|---|---|---|---|
| 2005/0051877 A1* | 3/2005 | Hsu | 257/667 |
| 2005/0104168 A1* | 5/2005 | Choi et al. | 257/666 |
| 2005/0151554 A1* | 7/2005 | Rae et al. | 324/760 |
| 2005/0263861 A1 | 12/2005 | Ahn et al. | |
| 2006/0112550 A1* | 6/2006 | Kim et al. | 29/884 |
| 2007/0052070 A1* | 3/2007 | Islam et al. | 257/666 |
| 2007/0075404 A1* | 4/2007 | Dimaano et al. | 257/666 |
| 2007/0164409 A1* | 7/2007 | Holland | 257/678 |
| 2007/0170555 A1* | 7/2007 | Camacho et al. | 257/666 |
| 2007/0187839 A1* | 8/2007 | Shim et al. | 257/784 |
| 2008/0001263 A1* | 1/2008 | Dimaano et al. | 257/666 |
| 2008/0054421 A1* | 3/2008 | Dimaano et al. | 257/676 |

* cited by examiner

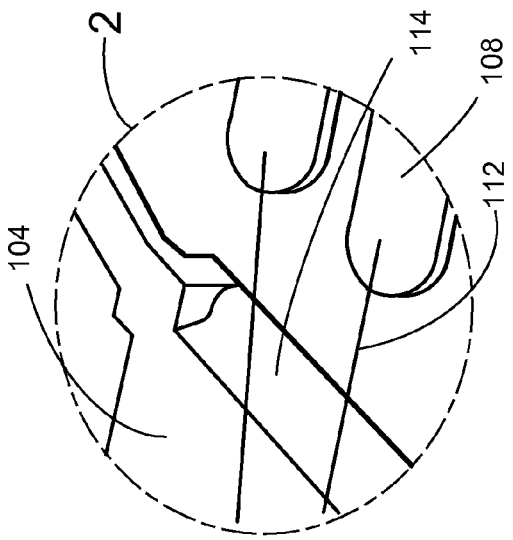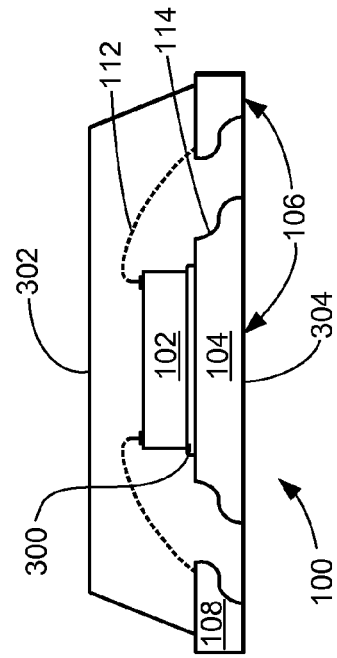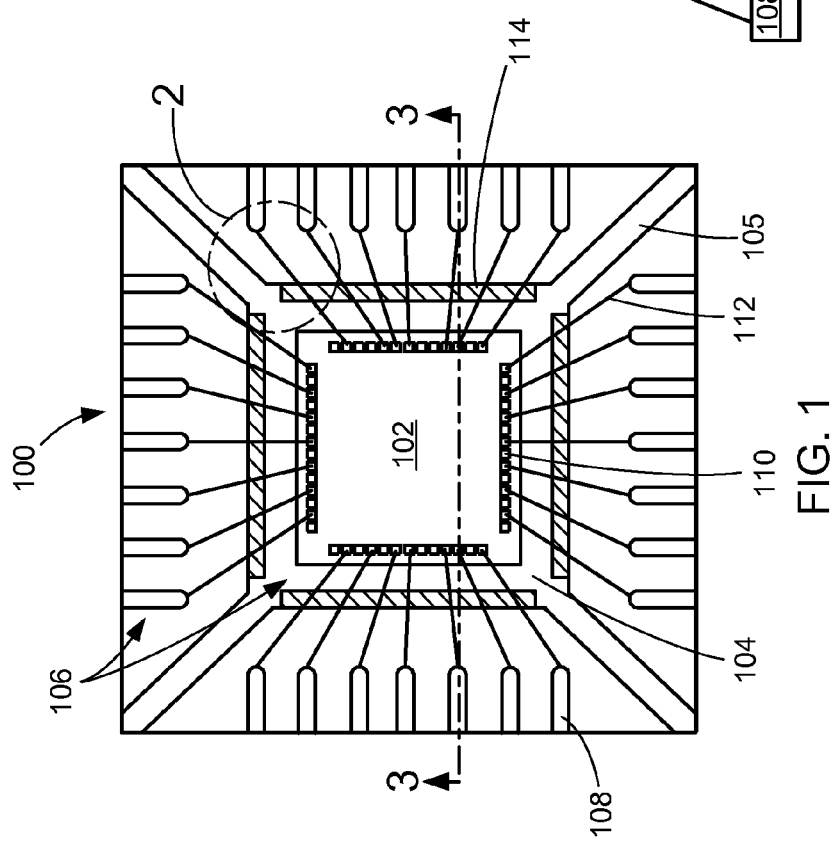

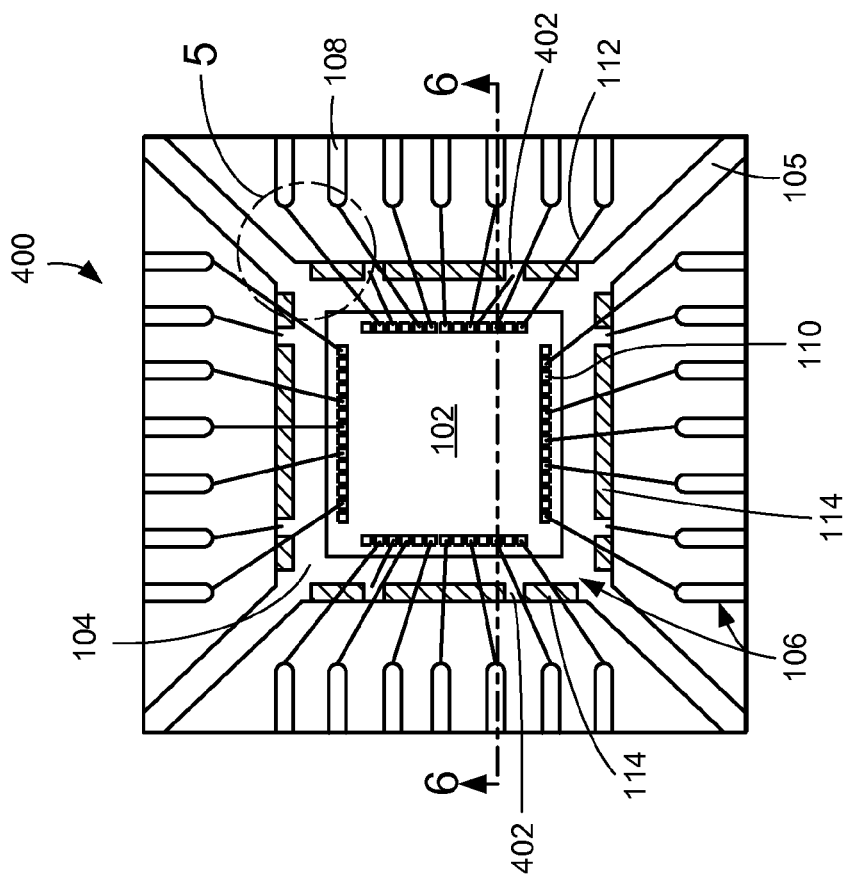
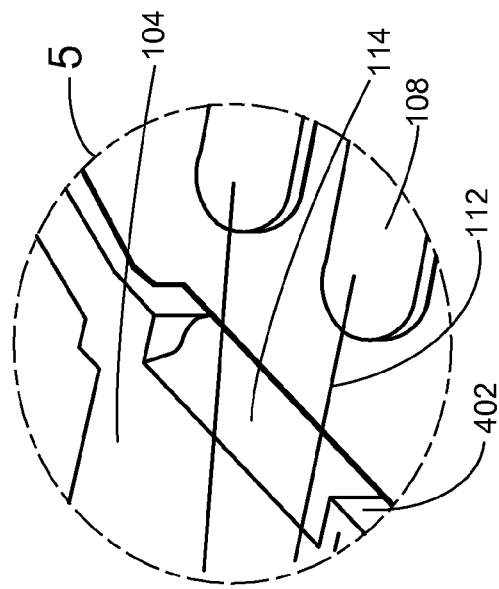
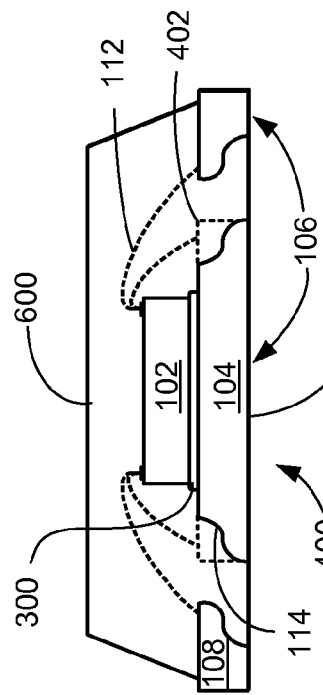

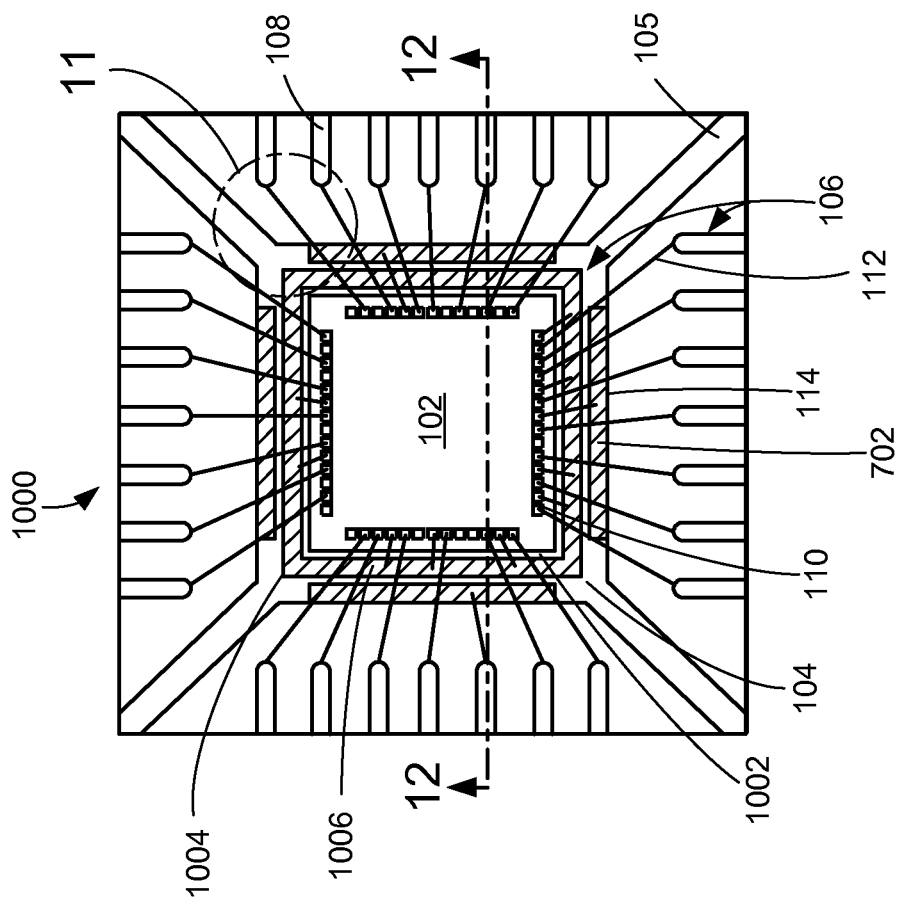
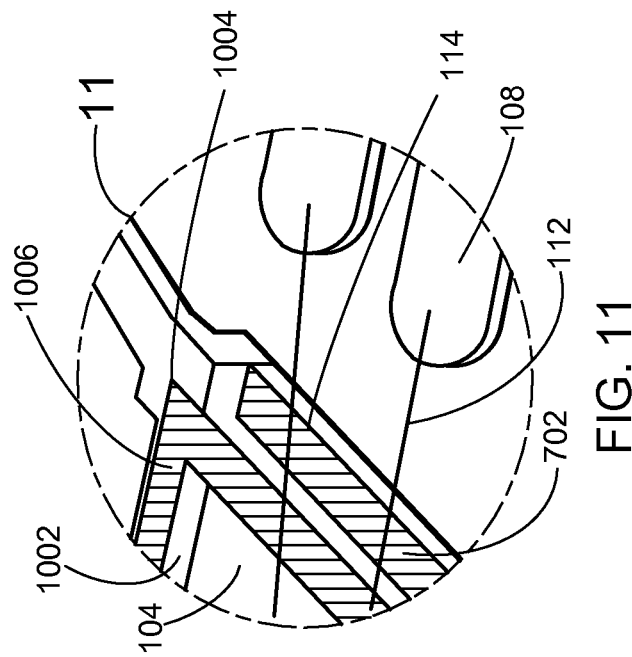
FIG. 10
FIG. 11

INTEGRATED CIRCUIT PACKAGE SYSTEM EMPLOYING A SUPPORT STRUCTURE WITH A RECESS

TECHNICAL FIELD

The present invention relates generally to integrated circuits, and more particularly to an integrated circuit package system employing a support structure with a recess.

BACKGROUND ART

Integrated circuits can be found in many of today's consumer electronics. For example, integrated circuits can be found in cellphones, video cameras, portable music players, computers, and even automobiles. The general principles of packaging an integrated circuit are well known. Ordinarily, a leadframe is employed which may include a die paddle and terminal leads arranged in a pre-selected arrangement around the periphery of the die paddle. A semiconductor device is attached to the die paddle and wire bonding or the like is used to interconnect bonding pads on the semiconductor device to the terminal leads. These assemblies are then encapsulated in a molding compound. This general process may be used to produce various integrated circuit package configurations.

Unfortunately, during encapsulation of the die paddle, the terminal leads, and the semiconductor device, the die paddle tends to lift causing a mold bleed problem at the periphery of the die paddle. It is believed that forces produced during mold flow of the encapsulation material cause the unwanted movement of the die paddle. Despite recognition of the mold bleed problem and one of its potential causes, mold bleed still remains one of the top defects seen on production lines. Furthermore, attempts at mold flash removal by various chemical processes have yet to prove very effective.

Thus, a need still remains for a reliable integrated circuit package system and method of fabrication, wherein the integrated circuit package system helps to prevent mold bleed during mold flow. In view of the ever-increasing commercial competitive pressures, increasing consumer expectations, and diminishing opportunities for meaningful product differentiation in the marketplace, it is increasingly critical that answers be found to these problems. Moreover, the ever-increasing need to save costs, improve efficiencies, and meet such competitive pressures adds even greater urgency to the critical necessity that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including: providing an electrical interconnect system including a support structure and a lead-finger system; processing a top edge of the support structure along an outermost periphery thereof, to include a recess for preventing mold bleed, the recess surrounded by the lead finger system; and encapsulating the recess and the electrical interconnect system with an encapsulation material to interlock the encapsulation material.

Certain embodiments of the invention have other aspects in addition to or in place of those mentioned above. The aspects will become apparent to those skilled in the art from a reading of the following detailed description when taken with reference to the accompanying drawings.

BRIEF DESCRIPTION OF THE DRAWINGS

FIG. 1 is a top view of an integrated circuit package system, in accordance with an embodiment of the present invention;

FIG. 2 is an enlarged view of the circle 2, of FIG. 1;

FIG. 3 is a cross sectional view of the structure of FIG. 1 taken along line 3-3;

FIG. 4 is a top view of an integrated circuit package system in accordance with another embodiment of the present invention;

FIG. 5 is an enlarged view of the circle 5, of FIG. 4;

FIG. 6 is a cross sectional view of the structure of FIG. 4 taken along line 6-6;

FIG. 10 is a top view of an integrated circuit package system, in accordance with another embodiment of the present invention;

FIG. 11 is an enlarged view of the circle 11, of FIG. 10;

BEST MODE FOR CARRYING OUT THE INVENTION

Figure 8:
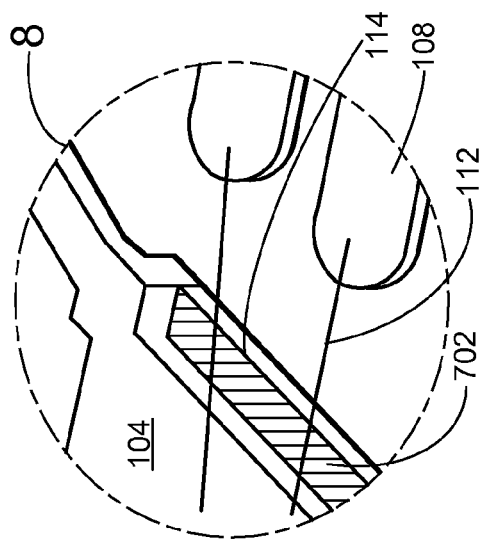
FIG. 8 is an enlarged view of the circle 8, of FIG. 7.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown exaggerated in the drawing FIGs. Additionally, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional plane or surface of the support structure, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The term "processed" or "processing" as used herein includes deposition of material or photoresist, patterning, exposure, development, etching, cleaning, and/or removal of the material or photoresist as required in forming a described structure.

Embodiment One

Referring now to FIG. 1, therein is shown a top view of an integrated circuit package system 100, in accordance with an embodiment of the present invention. For purposes of illustration and ease of discussion, an encapsulating material (described in FIG. 3) has been removed.

The integrated circuit package system 100 includes a device 102, a support structure 104, a corner tie bar 105, an electrical interconnect system 106, a lead-finger system 108, a device bonding pad 110, a wire bond 112, and a recess 114. By way of example, the device 102 may include semiconductor chips and integrated circuit packages selected from active components, passive components, stacked components, memory components, and so forth, in numerous configurations and arrangements as may be needed. It is to be understood that the device 102 covers a wide range of semiconductor chip and integrated circuit package configurations involving various sizes, dimensions, and electrical contact techniques, and the type of chip or package configuration employed should only be limited by the design specifications of the integrated circuit package.

Furthermore, it is to be understood that the device 102 or the integrated circuit package system 100 may include package configurations, such as Package-in-Package (PiP) and Package-on-Package (PoP) configurations. The PiP system is a 3D package system that stacks a fully tested Internal Stacking Module (ISM) on top of a Base Assembly Package (BAP) to form a single Chip Scale Package (CSP). PoP is a 3D package in which fully tested packages are stacked on top of another single or stacked package during the board mount process. As an exemplary illustration, the device 102 may include a PiP configuration or a PoP configuration. Additionally, by way of example, the integrated circuit package system 100, itself, may include a PiP configuration or a PoP configuration.

The support structure 104 supports the device 102 and may include a die attach paddle, for example, but may include any structure suitable for supporting the device 102. The device 102 is secured to the support structure 104 by adhesives well known in the art and not repeated herein. Notably, the present invention may employ "zero-fillet" technology when securing the device 102 to the support structure 104. The support structure 104 is held in place by the corner tie bar 105.

The electrical interconnect system 106, which includes the support structure 104 and the lead-finger system 108, provides an electrical interface between external electrical circuits and the device 102. More specifically, the device bonding pad 110 of the device 102 is electrically connected to the lead-finger system 108 via the wire bond 112. As an exemplary illustration, the lead-finger system 108 may fan out from the device 102 and terminate at the periphery of the package to create a quad flat non-leaded package (QFN).

It will be appreciated by those skilled in the art that the wire bond 112 can be deposited using materials and techniques well known within the art and are not repeated herein. For purposes of illustration, the wire bond 112 may include power wire bonds, signal wire bonds, ground bond wire bonds, and down bond wire bonds. Ground bond and down bond are wire bonding processes that allow the wire bond 112 to be bonded directly to the support structure 104 for purposes of grounding.

By way of example, the electrical interconnect system 106 may include a thin metal sheet, a conductive plated pattern on plastic tape, or any structure suitable for electrically interconnecting the device 102 to an external electrical circuit. As exemplary illustrations, the electrical interconnect system 106 can be formed by stamping, cutting or etching processes.

The electrical interconnect system 106 may include leads selected from: gull-wing leads, j-leads, leadless leads that wrap around the package edge to maintain a low profile, downset leads, pin leads, ball leads, single in-line leads, dual in-line leads, quad leads, and/or quad flat non-leaded leads. However, it is to be understood that the present invention is not to be limited to these examples. In accordance with the scope of the present invention, the electrical interconnect system 106 may include any electrical interconnection structure (i.e.—leads) that facilitates the incorporation of the integrated circuit package system 100 into a higher-level assembly, such as a printed circuit board or other suitable structure for supporting the integrated circuit package system 100.

Additionally, for even greater interconnect density, the lead-finger system 108 of the electrical interconnect system 106 may employ single row, dual row and/or half-etched leads or lands. Furthermore, the lead-finger system 108 may be made from any type of material that provides an electrically conductive and bondable surface for the wire bond 112. For example, the lead-finger system 108 may be made from a copper alloy or a nickel/palladium combination.

Notably, a top edge or periphery of the support structure 104 is processed to form the recess 114. The present inventors have discovered that by forming the recess 114 along a top edge of the support structure 104 that the recess 114 helps to prevent lifting of the support structure 104 during mold flow. The present inventors have noted that this lifting at the periphery of the support structure 104 can cause a mold bleed problem that affects package quality.

More specifically, the present inventors have discovered that the forces encountered during mold flow can be manipulated to prevent lifting of the support structure 104 by strategically designing/configuring the recess 114. By configuring the recess 114 appropriately, previously destructive upward mold flow stresses encountered during encapsulation are redirected downwards, thereby helping to prevent lifting of the support structure 104. Generally, the design of the recess 114 may include a configuration that is bounded, in part, by a portion of the support structure 104 left remaining below the recess 114 after processing. By way of example, the recess 114 may be appropriately configured by designing the recess 114 to include a contoured configuration. For purposes of illustration, the contoured configuration of the recess 114 may substantially mimic the shape of the letter "S". However, it is to be understood that the scope of the present invention is not to be limited to this example. In accordance with the scope of the present invention, the design of the recess 114 may include any shape that helps to prevent the support structure 104 from lifting during mold flow.

Per this embodiment, the recess 114 is formed uninterrupted along the length of each top edge of the support structure 104. However, it is to be understood that although the present embodiment depicts the recess 114 formed along all four top edges of the support structure 104, the recess 114 may be formed along any number of top edges as desired by the design engineer.

Circle 2 outlines an area that will be blown up for illustration purposes in FIG. 2.

Referring now to FIG. 2, therein is shown an enlarged view of the circle 2, of FIG. 1. This illustration more clearly depicts the contoured configuration of the recess 114 located along the top edge of the support structure 104. As is evident from the disclosure herein, the mold flow stresses encountered during encapsulation are directed downwards due to the contoured shaping of the recess 114. By directing the mold flow stresses downwards, the present inventors have found that the incidences of lifting of the support structure 104 are greatly reduced, and therefore, the occurrence of mold bleed is also greatly reduced. The wire bond 112 connects the lead-finger system 108 to the device bonding pad 110, of FIG. 1.

Referring now to FIG. 3, therein is shown a cross sectional view of the structure of FIG. 1 taken along line 3-3. The integrated circuit package system 100 includes the device 102, the support structure 104, the electrical interconnect system 106, the lead-finger system 108, the wire bond 112, a device adhesive 300, an encapsulation material 302, and a support structure bottom side 304. The wire bond 112 is shown as a hidden line due to the encapsulation material 302. This view also illustrates the contoured configuration of the recess 114 formed along the top edge of the support structure 104. As is evident from the disclosure herein, top center and side reservoir mold flows, for example, would produce downward forces upon the support structure 104, which would help prevent lifting of the support structure 104 and subsequent mold bleed problems.

This view also illustrates how the lead-finger system 108 may incorporate half-etched leads, thereby improving an interlocking effect between the lead-finger system 108 and the encapsulation material 302.

The encapsulation material 302 is deposited over the integrated circuit package system 100. Notably, the encapsulation material 302 does not cover at least a portion of the support structure bottom side 304. By leaving the support structure bottom side 304 exposed to the external environment, the ability of the integrated circuit package system 100 to dissipate heat is greatly improved. Moreover, the improved thermal dissipation ability of the integrated circuit package system 100 can be further enhanced by attaching a thermally conductive substrate or a heat sink adjacent the support structure 104. By improving the ability of the integrated circuit package system 100 to dissipate heat, the reliability and the useful life of the integrated circuit package system 100 can be improved.

Furthermore, the encapsulation material 302 not only protects the integrated circuit package system 100 from the external environment but it also provides support and stability to the package structure. Notably, the present inventors have discovered that the formation of the recess 114 further improves the interlocking of the encapsulation material 302 with the electrical interconnect system 106, thereby creating a package less subject to delamination problems. The encapsulation material 302 and molding techniques using it are well known in the art and not repeated herein.

An additional aspect of the present invention is that it allows for testing of the device 102 before adhering it to the electrical interconnect system 106, therefore ensuring the use of known good die or packages in the manufacturing process. Additionally, after adhering the device 102 to the electrical interconnect system 106, these assemblies (i.e.—the integrated circuit package system 100) can also be tested before incorporation into additional package systems. This ensures that the final product includes known good assemblies, and thereby improves the manufacturing process yield for packaging.

Although the present embodiment only illustrates a single device (i.e.—the device 102) stacked over the support structure 104, the scope of the present invention includes any number of devices (i.e.—active or passive) stacked over the support structure 104 to achieve the desired purpose of the integrated circuit package system 100. As is evident from the disclosure herein, a second device and a third device may be stacked over the device 102 to achieve a higher-density form of the integrated circuit package system 100. To achieve stacking, various inter-device structures, such as adhesives with or without thermally conducting capabilities, spacers, dummy devices, electromagnetic interference shields for blocking potentially disruptive energy fields, or a combination thereof, may be employed.

Referring now to FIGS. 4 through 6. FIGS. 4 through 6 depict similar configurations as to that shown in FIGS. 1 through 3, and consequently, only the differences between the figures will be described, to avoid redundancy.

Embodiment Two

FIG. 4 depicts a top view of an integrated circuit package system 400 in accordance with another embodiment of the present invention. For purposes of illustration and ease of discussion, the encapsulating material has been removed. The integrated circuit package system 400 includes the device 102, the support structure 104, the corner tie bar 105, the electrical interconnect system 106, the lead-finger system 108, the device bonding pad 110, the wire bond 112, the recess 114, and a ground structure 402.

Per this embodiment, the top edge or periphery of the support structure 104 is processed to include the ground structure 402 formed within the recess 114. The ground structure 402 may include a projection that separates or interrupts the recess 114 along the top edge or periphery of the support structure 104. The ground structure 402 may provide a grounding point for the wire bond 112 from the device 102 (i.e.—a down bond) or for the wire bond 112 from the lead-finger system 108 (i.e.—a ground bond). The ground structure 402 may be processed to include any type of material that provides an electrically conductive and bondable surface for the wire bond 112.

As an exemplary illustration, the present embodiment depicts forming two of the ground structure(s) 402 per side of the support structure 104, thereby separating the recess 114 into three separate regions. However, the present invention is not to be limited to this example. In accordance with the scope of the present invention, the top edge of the support structure 104 may be processed to include any number of the ground structure 402 and any number of the recess 114 to help meet the design requirements of the package.

Circle 5 outlines an area that will be blown up for illustration purposes in FIG. 5.

Referring now to FIG. 5, therein is shown an enlarged view of the circle 5, of FIG. 4. This illustration depicts the contoured configuration of the recess 114 located along the top edge of the support structure 104. Furthermore, this view depicts the formation of the ground structure 402 adjacent the recess 114, thereby interrupting the formation of the recess 114 as a continuous structure along the top edge of the support structure 104. This design variation offers enhanced grounding capability, while still providing enough mold flow force adjustment to prevent lifting of the support structure 104. The wire bond(s) 112 connect the device 102, of FIG. 4, to the lead-finger system 108 and to the ground structure 402, as well as, connect the lead-finger system 108 to the ground structure 402.

Referring now to FIG. 6, therein is shown a cross sectional view of the structure of FIG. 4 taken along line 6-6. The integrated circuit package system 400 includes the device 102, the support structure 104, the electrical interconnect system 106, the lead-finger system 108, the wire bond 112, the device adhesive 300, the support structure bottom side 304, the ground structure 402, and an encapsulation material 600. The wire bond 112 and the ground structure 402 are shown with hidden lines due to the encapsulation material 600.

This view also illustrates the contoured configuration of the recess 114 formed along the top edge of the support structure 104. As is evident from the disclosure herein, the mold flow stresses encountered during encapsulation are directed downwards due to the contoured shaping of the recess 114, and consequently, the incidences of lifting of the support structure 104 are greatly reduced.

Embodiment Three

Figure 7:
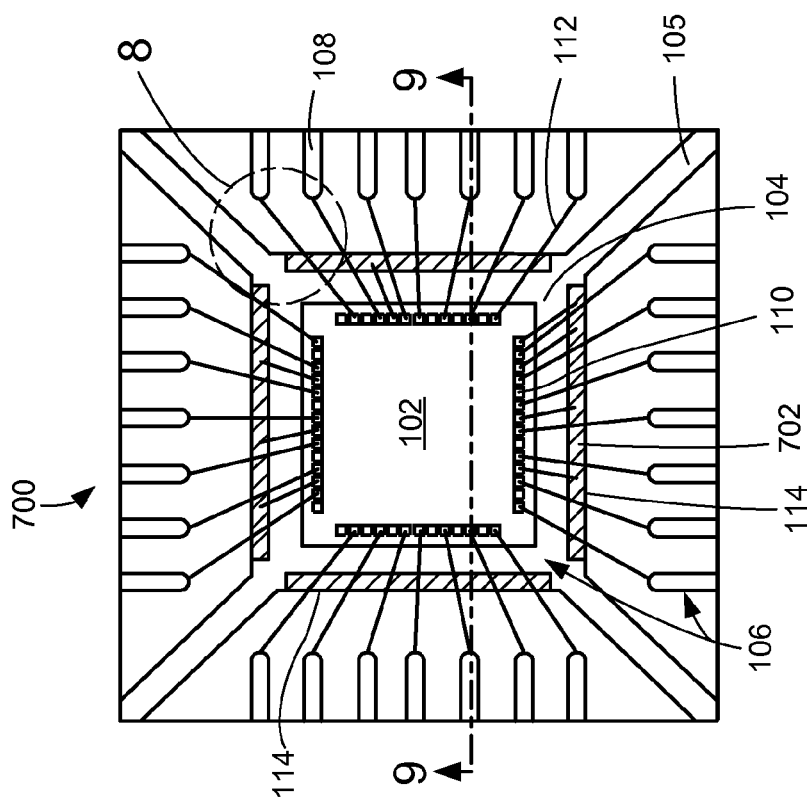
FIG. 7 is a top view of an integrated circuit package system, in accordance with another embodiment of the present invention.

Referring now to FIG. 7, therein is shown a top view of an integrated circuit package system 700, in accordance with another embodiment of the present invention. For purposes of illustration and ease of discussion, the encapsulating material has been removed.

The integrated circuit package system 700 includes the device 102, the support structure 104, the corner tie bar 105, the electrical interconnect system 106, the lead-finger system 108, the device bonding pad 110, the wire bond 112, the recess 114, and a first low resistivity interface 702. By way of example, the device 102 may include semiconductor chips and integrated circuit packages selected from active components, passive components, stacked components, memory components, and so forth, in numerous configurations and arrangements as may be needed. It is to be understood that the device 102 covers a wide range of semiconductor chip and integrated circuit package configurations involving various sizes, dimensions, and electrical contact techniques, and the type of chip or package configuration employed should only be limited by the design specifications of the integrated circuit package.

Furthermore, it is to be understood that the device 102 or the integrated circuit package system 700 may include package configurations, such as Package-in-Package (PiP) and Package-on-Package (PoP) configurations. The PiP system is a 3D package system that stacks a fully tested Internal Stacking Module (ISM) on top of a Base Assembly Package (BAP) to form a single Chip Scale Package (CSP). PoP is a 3D package in which fully tested packages are stacked on top of another single or stacked package during the board mount process. As an exemplary illustration, the device 102 may include a PiP configuration or a PoP configuration. Additionally, by way of example, the integrated circuit package system 700, itself, may include a PiP configuration or a PoP configuration.

The support structure 104 supports the device 102 and may include a die attach paddle, for example, but may include any structure suitable for supporting the device 102. The device 102 is secured to the support structure 104 by adhesives well known in the art and not repeated herein. Notably, the present invention may employ "zero-fillet" technology when securing the device 102 to the support structure 104. The support structure 104 is held in place by the corner tie bar 105.

The electrical interconnect system 106, which includes the support structure 104 and the lead-finger system 108, provides an electrical interface between external electrical circuits and the device 102. More specifically, the device bonding pad 110 of the device 102 is electrically connected to the lead-finger system 108 via the wire bond 112. As an exemplary illustration, the lead-finger system 108 may fan out from the device 102 and terminate at the periphery of the package to create a quad flat non-leaded package (QFN).

It will be appreciated by those skilled in the art that the wire bond 112 can be deposited using materials and techniques well known within the art and are not repeated herein. For purposes of illustration, the wire bond 112 may include power wire bonds, signal wire bonds, ground bond wire bonds, and down bond wire bonds. Ground bond and down bond are wire bonding processes that allow the wire bond 112 to be bonded directly to the support structure 104 for purposes of grounding.

By way of example, the electrical interconnect system 106 may include a thin metal sheet, a conductive plated pattern on plastic tape, or any structure suitable for electrically interconnecting the device 102 to an external electrical circuit. As exemplary illustrations, the electrical interconnect system 106 can be formed by stamping, cutting or etching processes.

The electrical interconnect system 106 may include leads selected from: gull-wing leads, j-leads, leadless leads that wrap around the package edge to maintain a low profile, downset leads, pin leads, ball leads, single in-line leads, dual in-line leads, quad leads, and/or quad flat non-leaded leads. However, it is to be understood that the present invention is not to be limited to these examples. In accordance with the scope of the present invention, the electrical interconnect system 106 may include any electrical interconnection structure (i.e.—leads) that facilitates the incorporation of the integrated circuit package system 700 into a higher-level assembly, such as a printed circuit board or other suitable structure for supporting the integrated circuit package system 700.

Additionally, for even greater interconnect density, the lead-finger system 108 of the electrical interconnect system 106 may employ single row, dual row and/or half-etched leads or lands. Furthermore, the lead-finger system 108 may be made from any type of material that provides an electrically conductive and bondable surface for the wire bond 112. For example, the lead-finger system 108 may be made from a copper alloy or a nickel/palladium combination.

Notably, a top edge or periphery of the support structure 104 is processed to form the recess 114. The present inventors have discovered that by forming the recess 114 along a top edge of the support structure 104 that the recess 114 helps to prevent lifting of the support structure 104 during mold flow. The present inventors have noted that this lifting at the periphery of the support structure 104 can cause a mold bleed problem that affects package quality.

More specifically, the present inventors have discovered that the forces encountered during mold flow can be manipulated to prevent lifting of the support structure 104 by strategically designing/configuring the recess 114. By configuring the recess 114 appropriately, previously destructive upward mold flow stresses encountered during encapsulation are redirected downwards, thereby helping to prevent lifting of the support structure 104. By way of example, the recess 114 may be appropriately configured by designing the recess 114 to include a step-shaped configuration. However, it is to be understood that the scope of the present invention is not to be limited to this example. In accordance with the scope of the present invention, the design of the recess 114 may include any shape that helps to prevent the support structure 104 from lifting during mold flow.

Per this embodiment, the recess 114 is formed uninterrupted along the length of each top edge of the support structure 104. Notably, the recess 114 may include the first low resistivity interface 702 for improved electrical grounding of the wire bond 112. By way of example, the first low resistivity interface 702 may include a material containing silver. However, the present invention is not to be limited to this example. In accordance with the scope of the present invention, the first low resistivity interface 702 may include any type of material that provides a low resistance electrical contact.

Furthermore, although the present embodiment depicts the recess 114 formed along all four top edges of the support structure 104, the recess 114 may be formed along any number of top edges as desired by the design engineer.

Circle 8 outlines an area that will be blown up for illustration purposes in FIG. 8.

Referring now to FIG. 8, therein is shown an enlarged view of the circle 8, of FIG. 7. This illustration more clearly depicts the step-shaped configuration of the recess 114 located along the top edge of the support structure 104. As is evident from the disclosure herein, the mold flow stresses encountered during encapsulation are directed downwards due to the step-shaped configuration of the recess 114. By directing the mold flow stresses downwards, the present inventors have found that the incidences of lifting of the support structure 104 are greatly reduced, and therefore, the occurrence of mold bleed is also greatly reduced. The wire bond 112 connects the lead-finger system 108 to the device bonding pad 110, of FIG. 7. A portion of the recess 114 may be covered with the first low resistivity interface 702.

Figure 9:
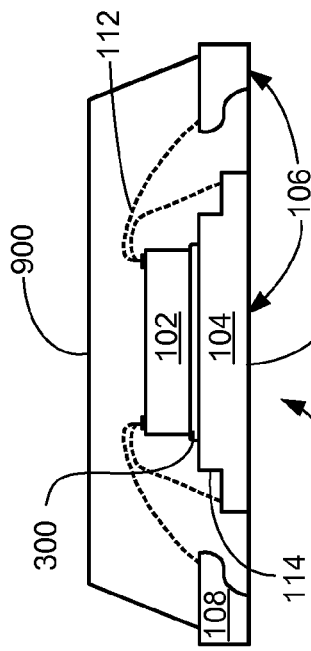
FIG. 9 is a cross sectional view of the structure of FIG. 7 taken along line 9-9.

Referring now to FIG. 9, therein is shown a cross sectional view of the structure of FIG. 7 taken along line 9-9. The integrated circuit package system 700 includes the device 102, the support structure 104, the electrical interconnect system 106, the lead-finger system 108, the wire bond 112, the device adhesive 300, the support structure bottom side 304, and an encapsulation material 900. The wire bond 112 is shown as a hidden line due to the encapsulation material 900. This view also illustrates the step-shaped configuration of the recess 114 formed along the top edge of the support structure 104. As is evident from the disclosure herein, top center and side reservoir mold flows, for example, would produce downward forces upon the support structure 104, which would help prevent lifting of the support structure 104 and subsequent mold bleed problems.

This view also illustrates how the lead-finger system 108 may incorporate half-etched leads, thereby improving an interlocking effect between the lead-finger system 108 and the encapsulation material 900.

The encapsulation material 900 is deposited over the integrated circuit package system 700. Notably, the encapsulation material 900 does not cover at least a portion of the support structure bottom side 304. By leaving the support structure bottom side 304 exposed to the external environment, the ability of the integrated circuit package system 700 to dissipate heat is greatly improved. Moreover, the improved thermal dissipation ability of the integrated circuit package system 700 can be further enhanced by attaching a thermally conductive substrate or a heat sink adjacent the support structure 104. By improving the ability of the integrated circuit package system 700 to dissipate heat, the reliability and the useful life of the integrated circuit package system 700 can be improved.

Furthermore, the encapsulation material 900 not only protects the integrated circuit package system 700 from the external environment but it also provides support and stability to the package structure. Notably, the present inventors have discovered that the formation of the recess 114 further improves the interlocking of the encapsulation material 900 with the electrical interconnect system 106, thereby creating a package less subject to delamination problems. The encapsulation material 900 and molding techniques using it are well known in the art and not repeated herein.

An additional aspect of the present invention is that it allows for testing of the device 102 before adhering it to the electrical interconnect system 106, therefore ensuring the use of known good die or packages in the manufacturing process. Additionally, after adhering the device 102 to the electrical interconnect system 106, these assemblies (i.e.—the integrated circuit package system 700) can also be tested before incorporation into additional package systems. This ensures that the final product includes known good assemblies, and thereby improves the manufacturing process yield for packaging.

Although the present embodiment only illustrates a single device (i.e.—the device 102) stacked over the support structure 104, the scope of the present invention includes any number of devices (i.e.—active or passive) stacked over the support structure 104 to achieve the desired purpose of the integrated circuit package system 700. As is evident from the disclosure herein, a second device and a third device may be stacked over the device 102 to achieve a higher-density form of the integrated circuit package system 700. To achieve stacking, various inter-device structures, such as adhesives with or without thermally conducting capabilities, spacers, dummy devices, electromagnetic interference shields for blocking potentially disruptive energy fields, smaller devices, or a combination thereof, may be employed.

Figure 12:
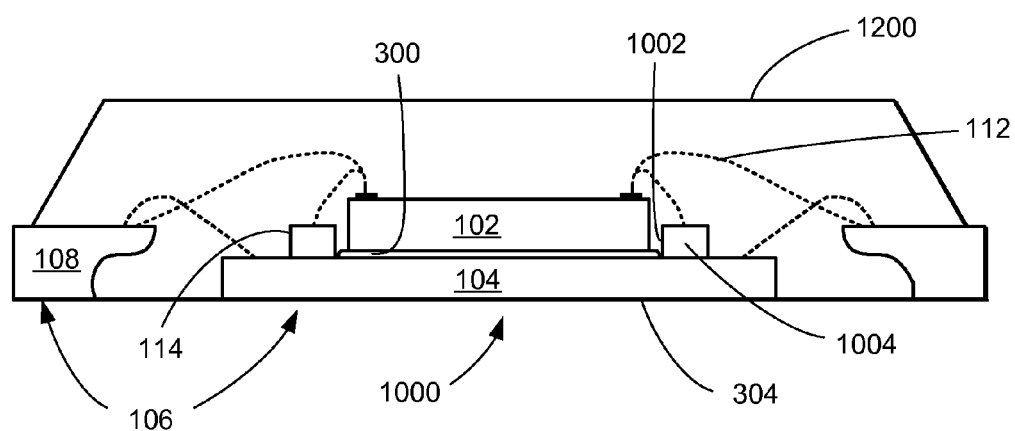
FIG. 12 is a cross sectional view of the structure of FIG. 10 taken along line 12—12.

Referring now to FIGS. 10 through 12. FIGS. 10 through 12 depict similar configurations as to that shown in FIGS. 7 through 9, and consequently, only the differences between the figures will be described, to avoid redundancy.

Embodiment Four

FIG. 10 depicts a top view of an integrated circuit package system 1000 in accordance with another embodiment of the present invention. For purposes of illustration and ease of discussion, the encapsulating material has been removed. The integrated circuit package system 1000 includes the device 102, the support structure 104, the corner tie bar 105, the electrical interconnect system 106, the lead-finger system 108, the device bonding pad 110, the wire bond 112, the recess 114, the first low resistivity interface 702, a recessed device region 1002, a ground ring 1004, and a second low resistivity interface 1006.

Per this embodiment, the central region of the support structure 104 is processed to form the recessed device region 1002 and the top edge or periphery of the support structure 104 is also processed to include the recess 114. The recessed device region 1002 includes a hollow space large enough to hold the device 102. Although the present embodiment depicts the recessed device region 1002 as square in shape, it is to be understood that the recessed device region 1002 may include any shape or size that is only limited by its ability to hold the device 102. The recessed device region 1002 helps to reduce the overall thickness profile of the integrated circuit package system 1000.

The ground ring 1004 includes a projection that separates the recess 114 from the recessed device region 1002. The ground ring 1004 may provide a grounding point for the device 102 (i.e.—a down bond) or for the lead-finger system (i.e.—a ground bond). To improve electrical connectivity to the ground ring 1004, the ground ring 1004 may be processed to include a layer of material such as the second low resistivity interface 1006. By way of example, the second low resistivity interface 1006 may include a material containing silver. However, the present invention is not to be limited to this example. In accordance with the scope of the present invention, the second low resistivity interface 1006 may include any type of material that provides a low resistance electrical contact.

This embodiment offers a design variation with increased flexibility for forming down bonds and ground bonds due to the formation of two low resistivity contact regions (i.e.—the first low resistivity interface 702 and the second low resistivity interface 1006) on the support structure 104.

Circle 11 outlines an area that will be blown up for illustration purposes in FIG. 11.

Referring now to FIG. 11, therein is shown an enlarged view of the circle 11, of FIG. 10. This illustration depicts the step-shaped configuration of the recess 114 located along the top edge of the support structure 104, as well as, the hollow space formed by the recessed device region 1002. Furthermore, this view depicts how the ground ring 1004 separates the recess 114 from the recessed device region 1002. This design variation offers increased down bond and ground bond formation flexibility (i.e.—by forming the first low resistivity interface 702 and the second low resistivity interface 1006), while still providing enough mold flow force adjustment to prevent lifting of the support structure 104. The wire bond(s) 112 may connect the device 102, of FIG. 10, to the ground ring 1004 and to the lead-finger system 108. The wire bond(s) 112 may also connect the lead-finger system 108 to the recess 114.

Referring now to FIG. 12, therein is shown a cross sectional view of the structure of FIG. 10 taken along line 12-12. The integrated circuit package system 1000 includes the device 102, the support structure 104, the electrical interconnect system 106, the lead-finger system 108, the wire bond 112, the device adhesive 300, the support structure bottom side 304, the recessed device region 1002, the ground ring 1004, and an encapsulation material 1200. The wire bond 112 is shown as a hidden line due to the encapsulation material 1200.

This view also illustrates the step-shaped configuration of the recess 114 formed along the top edge of the support structure 104, as well as, the hollow space formed by the recessed device region 1002. As is evident from the disclosure herein, the mold flow stresses encountered during encapsulation are directed downwards due to the step-shaped configuration of the recess 114, and consequently, the incidences of lifting of the support structure 104 are greatly reduced.

Figure 13:
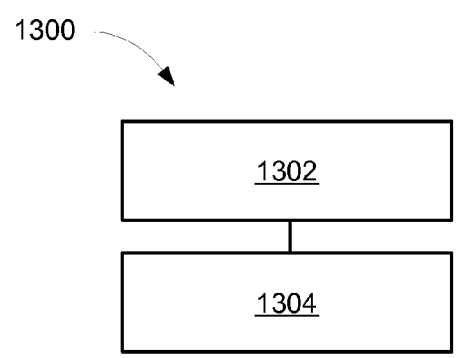
FIG. 13 is a flow chart of an integrated circuit package system for the integrated circuit package system, in accordance with an embodiment of the present invention.

Referring now to FIG. 13, therein is shown a flow chart of an integrated circuit package system 1300 for the integrated circuit package system 100, 400, 700 and 1000, in accordance with an embodiment of the present invention. The integrated circuit package system 1300 includes providing an electrical interconnect system including a support structure and a lead-finger system in a block 1302; and processing a top edge of the support structure to include a recess for preventing mold bleed in a block 1304.

It has been discovered that the present invention thus has numerous aspects. A principle aspect is that the present invention helps to prevent lifting of the support structure during mold flow and subsequent mold bleed. The present invention achieves this by designing a recess to constructively manipulate the forces encountered during mold flow, thereby preventing lift of the support structure.

Another aspect of the present invention is the improved interlocking between the encapsulation material and the electrical interconnect system. By forming the recesses within the support structure, the encapsulation material is better able to secure itself to the electrical interconnect system, thereby reducing the incidence of delamination.

Yet another aspect of the present invention is that it provides increased flexibility for attachment of down bonds and ground bonds. The present invention achieves this aspect by providing low resistivity contact locations for forming these bonds.

Yet another aspect of the present invention is that it helps to eliminate the post-processing step of mold flash removal.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system of the present invention furnishes important and heretofore unknown and unavailable solutions, capabilities, and functional aspects for preventing mold bleed problems associated with support structure lift during mold flow. The resulting processes and configurations are straightforward, cost-effective, uncomplicated, highly versatile and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. An integrated circuit package system comprising:
   an electrical interconnect system including a support structure and a lead-finger system;
   a recess along a top edge of the support structure at an outermost periphery thereof for preventing mold bleed, the recess bounded by a portion of the support structure below the recess and surrounded by the leadfinger system; and
   an encapsulation material encapsulating the recess and the electrical interconnect system to interlock the encapsulation material.

2. The system as claimed in claim 1 wherein:
   the recess includes an s-shaped configuration.

3. The system as claimed in claim 1 wherein:
   the recess includes a step shaped configuration with a first low resistivity interface.

4. The system as claimed in claim 1 wherein:
   the support structure includes a ground ring.

5. The system as claimed in claim 1 further comprising:
   a ground structure within the recess.

6. The system as claimed in claim 1 further comprising:
   a device over the support structure;
   the device connected to the lead-finger system; and
   a support structure bottom side exposed for thermal dissipation.

7. The system as claimed in claim 6 further comprising:
   the device connected to a ground structure or a ground ring.

8. The system as claimed in claim 1 wherein:
   the integrated circuit package system includes a quad flat non-leaded package.

9. The system as claimed in claim 1 wherein:
   the lead-finger system includes half-etched leads.

10. The system as claimed in claim 1 further comprising:
    a first low resistivity interface over the recess; and
    a second low resistivity interface over a ground ring.

* * * * *